(12) United States Patent
Kato et al.

(10) Patent No.: US 10,554,915 B2
(45) Date of Patent: Feb. 4, 2020

(54) IMAGING SENSOR AND MOVING BODY

(71) Applicant: CANON KABUSHIKI KAISHA, Tokyo (JP)

(72) Inventors: Taro Kato, Tokyo (JP); Kazuya Igarashi, Tokyo (JP); Masahiro Kobayashi, Tokyo (JP); Hidekazu Takahashi, Zama (JP); Akinari Takagi, Yokosuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 154 days.

(21) Appl. No.: 15/445,462

(22) Filed: Feb. 28, 2017

(65) Prior Publication Data

US 2017/0257586 A1  Sep. 7, 2017

(30) Foreign Application Priority Data

Mar. 4, 2016 (JP) .................................. 2016-042681

(51) Int. Cl.
| | |
|---|---|
| *H04N 5/369* | (2011.01) |
| *H01L 27/146* | (2006.01) |
| *G06T 7/536* | (2017.01) |
| *B60W 30/08* | (2012.01) |
| *G05D 1/02* | (2006.01) |

(Continued)

(52) U.S. Cl.
CPC .......... *H04N 5/3696* (2013.01); *B60W 30/08* (2013.01); *G05D 1/0246* (2013.01); *G06T 7/536* (2017.01); *G08G 1/16* (2013.01); *H01L 27/14605* (2013.01); *H01L 27/14607* (2013.01); *H01L 27/307* (2013.01); *H04N 5/23212* (2013.01); *H04N 5/36961* (2018.08); *H04N 5/378* (2013.01); *H04N 7/183* (2013.01); *B60W 2420/42* (2013.01); *G06K 9/00805* (2013.01); *G06T 2207/10028* (2013.01); *G06T 2207/30261* (2013.01)

(58) Field of Classification Search
CPC .... H04N 5/36961; H04N 5/369; H04N 5/379; H04N 5/3969–39691; H01L 27/14605; H01L 27/14607

See application file for complete search history.

(56) References Cited

U.S. PATENT DOCUMENTS 8,102,460 B2 * 1/2012 Awazu ................. G02B 3/0043
                                                            348/335
9,224,771 B2 * 12/2015 Yamashita ........ H01L 27/14609
(Continued)

FOREIGN PATENT DOCUMENTS

JP  2007-158692 A  6/2007
JP  2007-243744 A  9/2007
(Continued)

*Primary Examiner* — Robert J Hance
(74) *Attorney, Agent, or Firm* — Canon USA, Inc., IP Division

(57) ABSTRACT

A pixel electrode includes a first electrode, a second electrode arranged so as to face the first electrode in a first direction, and a third electrode. A counter electrode is provided in an upper portion of the pixel electrode, and a photoelectric conversion layer is arranged so as to be sandwiched by the pixel electrode and the counter electrode. A length of the third electrode in a predetermined direction is shorter than a length of the first electrode and a length of the second electrode.

16 Claims, 12 Drawing Sheets

(51) Int. Cl.
  *G08G 1/16*     (2006.01)
  *H01L 27/30*    (2006.01)
  *H04N 5/232*    (2006.01)
  *H04N 5/378*    (2011.01)
  *H04N 7/18*     (2006.01)
  *G06K 9/00*     (2006.01)

(56)     References Cited

U.S. PATENT DOCUMENTS

| | | |
|---|---|---|
| 10,136,091 B2 | 11/2018 | Ono et al. |
| 2009/0141153 A1* | 6/2009 | Onozawa .......... H01L 27/14605 |
| | | 348/294 |
| 2013/0075849 A1* | 3/2013 | Suzuki .............. H01L 27/14605 |
| | | 257/432 |
| 2015/0288901 A1* | 10/2015 | Tanaka ............. H01L 27/14605 |
| | | 250/208.1 |
| 2016/0182792 A1* | 6/2016 | Aoki ........................ G03B 9/02 |
| | | 348/364 |
| 2016/0182794 A1* | 6/2016 | Aoki ...................... H04N 5/243 |
| | | 348/229.1 |
| 2017/0077165 A1* | 3/2017 | Kimura ............. H01L 27/14643 |
| 2018/0309947 A1* | 10/2018 | Hatano ............. H01L 27/14632 |
| 2019/0074307 A1* | 3/2019 | Kita ..................... H01L 27/146 |

FOREIGN PATENT DOCUMENTS

| | | |
|---|---|---|
| JP | 2012-191400 A | 10/2012 |
| JP | 2014-067948 A | 4/2014 |
| JP | 2014-195296 A | 10/2014 |
| JP | 2015-207594 A | 11/2015 |
| JP | 2015-226255 A | 12/2015 |

\* cited by examiner

IMAGING SENSOR AND MOVING BODY

BACKGROUND

Field of the Disclosure

The present disclosure generally relates to imaging and, more particularly, to an imaging sensor that can perform distance measurement and a moving body.

Description of the Related Art

A configuration as an imaging sensor provided with a pixel including a light receiving unit where a photoelectric conversion layer is formed on a substrate has been proposed. Japanese Patent Laid-Open No. 2014-67948 describes an imaging sensor using an organic photoelectric conversion layer as the photoelectric conversion layer. On the other hand, an imaging sensor provided with an autofocus (AF) function for automatically performing focus adjustment at the time of imaging have been widely popularized. Japanese Patent Laid-Open No. 2014-67948 also describes that a light shielding film for shielding part of incident light is provided between the photoelectric conversion layer and a micro lens, and focus detection is performed on the basis of a phase difference method. According to this imaging plane phase difference method, a de-focusing amount and a distance to an object are obtained by using trigonometrical focusing principles from a phase difference of parallax images based on light beams that have passed different areas (pupil areas) on a lens pupil.

SUMMARY

An imaging sensor according to one or more aspects of the present disclosure relates to an imaging sensor including a plurality of pixels two-dimensionally arranged on a substrate, a pixel electrode that is provided on the substrate and that includes a first electrode, a second electrode arranged so as to face the first electrode in a first direction, and a third electrode, a counter electrode provided in an upper portion of the pixel electrode, and a photoelectric conversion layer arranged so as to be sandwiched by the pixel electrode and the counter electrode, in which a width of the third electrode in the first direction is shorter than a distance between the first electrode and the second electrode, and a length of the third electrode in a second direction corresponding to a direction orthogonal to the first direction is shorter than a length of the first electrode and a length of the second electrode.

Further features of the present disclosure will become apparent from the following description of exemplary embodiments with reference to the attached drawings.

DESCRIPTION OF THE EMBODIMENTS

Exemplary embodiments for implementing aspects of the present disclosure will be described below with reference to the drawings.

An imaging sensor for an in-vehicle camera is desired in which a depth of field is deepened to avoid blurring over an entirety of a picked-up image while a high focusing accuracy is maintained for a purpose of obtaining information for self-governing movement. However, sufficient study has not been conducted with regard to an element configuration for realizing both a high focusing accuracy and a deep depth of field according to the configuration described in Japanese Patent Laid-Open No. 2014-67948. In view of the above, according to one or more aspects of the present disclosure, an imaging sensor in which the high focusing accuracy and the deep depth of field are both realized as compared with Japanese Patent Laid-Open No. 2014-67948 is provided.

Figure 8:
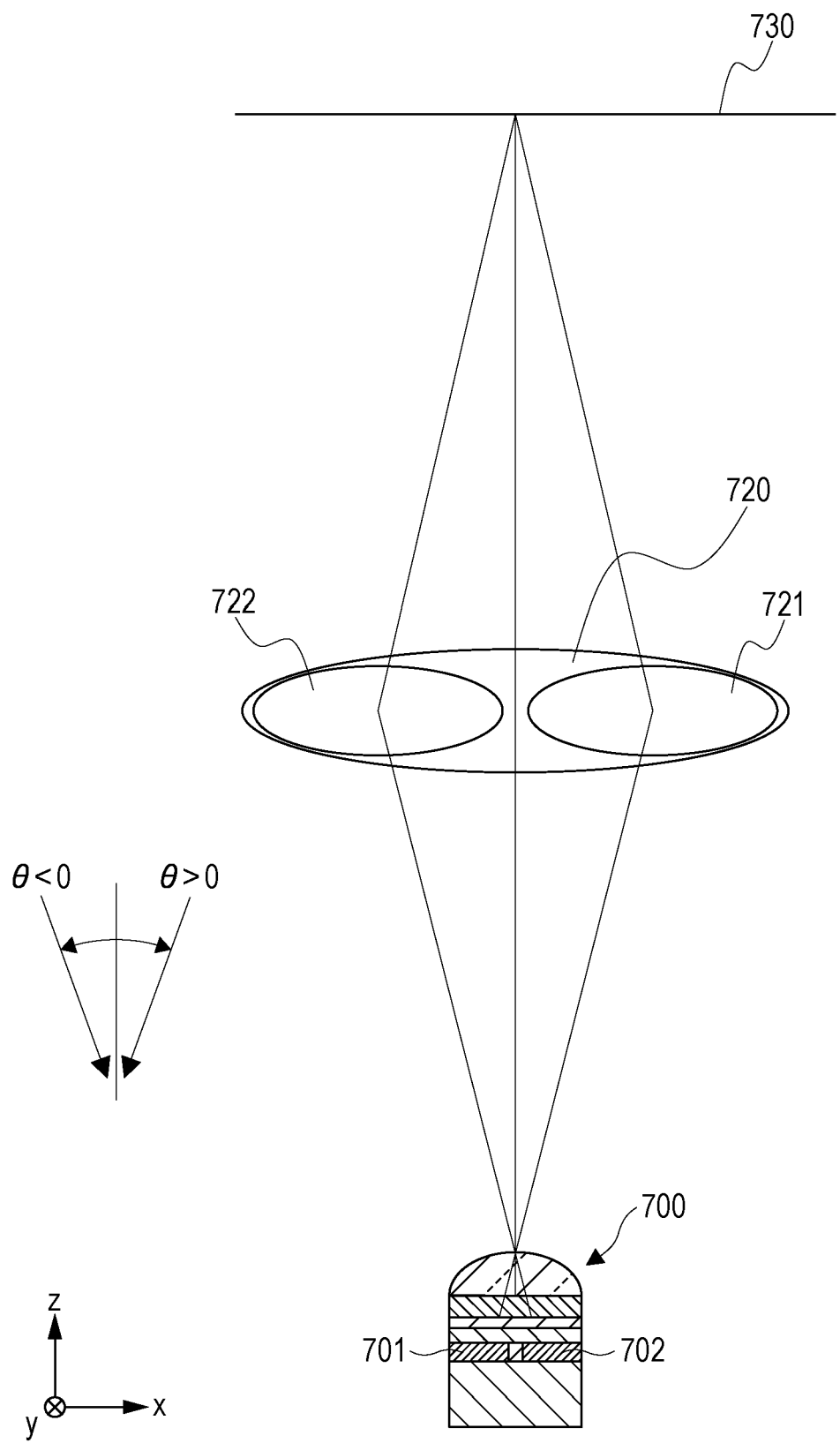
FIG. 8 is an explanatory diagram for describing a comparison example according to one or more aspects of the present disclosure.

FIG. 8 illustrates a focusing pixel 700, an exit pupil 720 of an imaging lens, and an object 730. It should be noted that, as being different from Japanese Patent Laid-Open No. 2014-67948, a mode in which phase difference detection is performed while a pixel electrode provided in a lower portion of a photoelectric conversion layer is set as divided electrodes will be described below.

In FIG. 8, an x direction is set as a pupil division direction, and divided areas of an exit pupil are respectively set as pupil areas 721 and 722. Light that has passed through the pupil area 721 generates charges in a portion located above an electrode 701 in the photoelectric conversion layer. On the other hand, light that has passed through the pupil area 722 generates charges in a portion located above an electrode 702 in the photoelectric conversion layer. Two parallax images are obtained from the signal charges collected by the electrode 701 and the signal charges collected by the electrode 702, and distance measurement can be performed by using the trigonometrical focusing principles.

A pixel in which both focusing and imaging can be performed is commonly configured in a manner that an area occupied by both the pupil areas 721 and 722 corresponding to the electrodes 701 and 702 becomes equal to a whole pupil area.

However, since it is demanded that the parallax is set to be larger from a perspective of the focusing accuracy, a distance between centroids of the pupil areas corresponding to each parallax needs to be lengthened.

Figure 9:
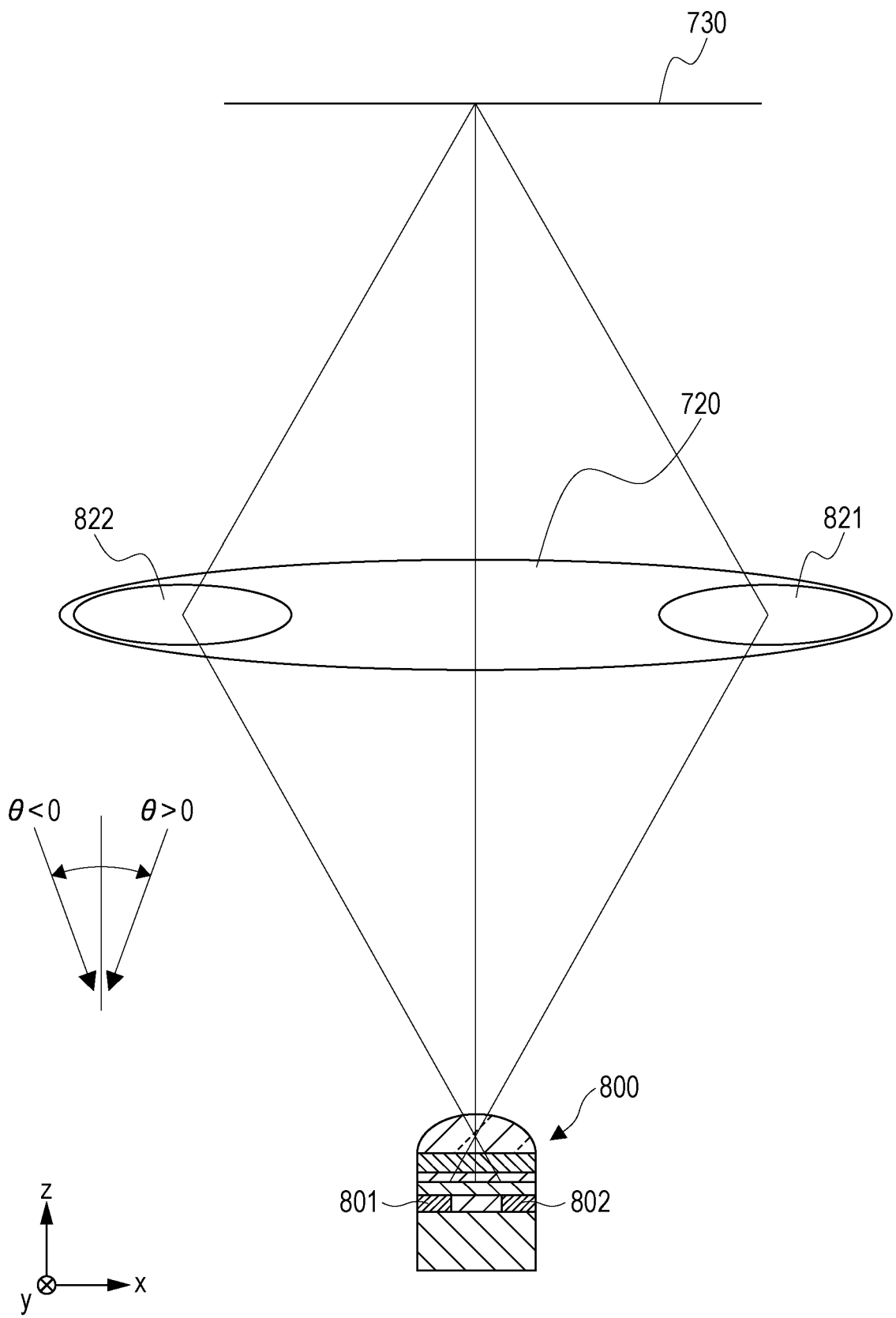
FIG. 9 is an explanatory diagram for describing an exemplary embodiment according to one or more aspects of the present disclosure.

In view of the above, according to one or more aspects of the present disclosure, a state is established in which a diaphragm of the lens is opened to set, for example, an open F-number to set apart a distance between centroids of the pupil areas 721 and 722, and the distance (base line length) between the centroids of the pupil areas 721 and 722 is increased. In addition, the two electrodes are respectively arranged in end portions of the pixel to further increase the distance between the centroids of the pupil areas 721 and 722 after sizes of the two electrodes are reduced. FIG. 9 illustrates the above-mentioned configuration, and electrodes 801 and 802 are arranged in the end portions of the pixel in a state in which the diaphragm of the lens is opened. As a result, a distance between centroids of pupil areas 821 and 822 in FIG. 9 is longer than the distance between the centroids of the pupil areas 721 and 722 in FIG. 8.

Figure 10:
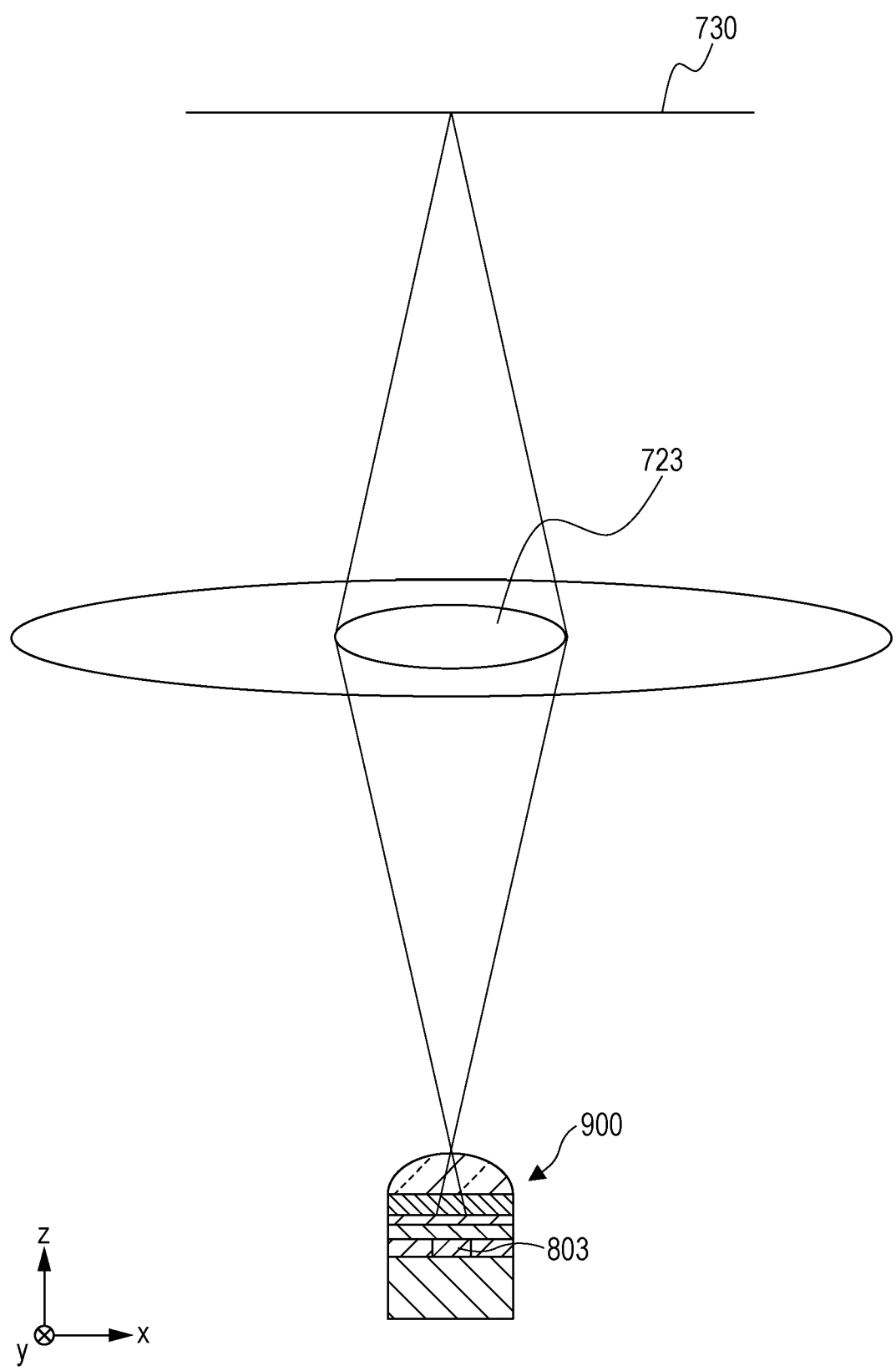
FIG. 10 is an explanatory diagram for describing an exemplary embodiment according to one or more aspects of the present disclosure.

Incidentally, when the diaphragm of the lens is set as the open F-number, for example, the depth of field is shallowed, and it becomes difficult to focus over the whole imaging area. For this reason, the above-described configuration is not appropriate to an in-vehicle imaging sensor in which imaging needs to be performed without blurring from a near end to a far end. In view of the above, according to one or more aspects of the present disclosure, a size of the electrode is decreased in both the x direction and a y direction in order that the pupil area through which the light beam used for the imaging passes is reduced by being limited in the vicinity of an optical axis. FIG. 10 illustrates the above-described configuration, and an area occupied by an electrode 803 of an imaging element 900 is decreased, and the electrode 803 is arranged in the vicinity of the center of the pixel. When the above-described configuration is adopted, it is possible to provide the imaging sensor in which the depth of field is not shallowed even in a case where the diaphragm of the lens is set as the open F-number, for example. That is, it is possible to provide the imaging sensor in which both the high focusing accuracy and the deep depth of field can be achieved. Hereinafter, respective exemplary embodiments will be described.

First Exemplary Embodiment

Overall Configuration of an Imaging Sensor

Figure 1:
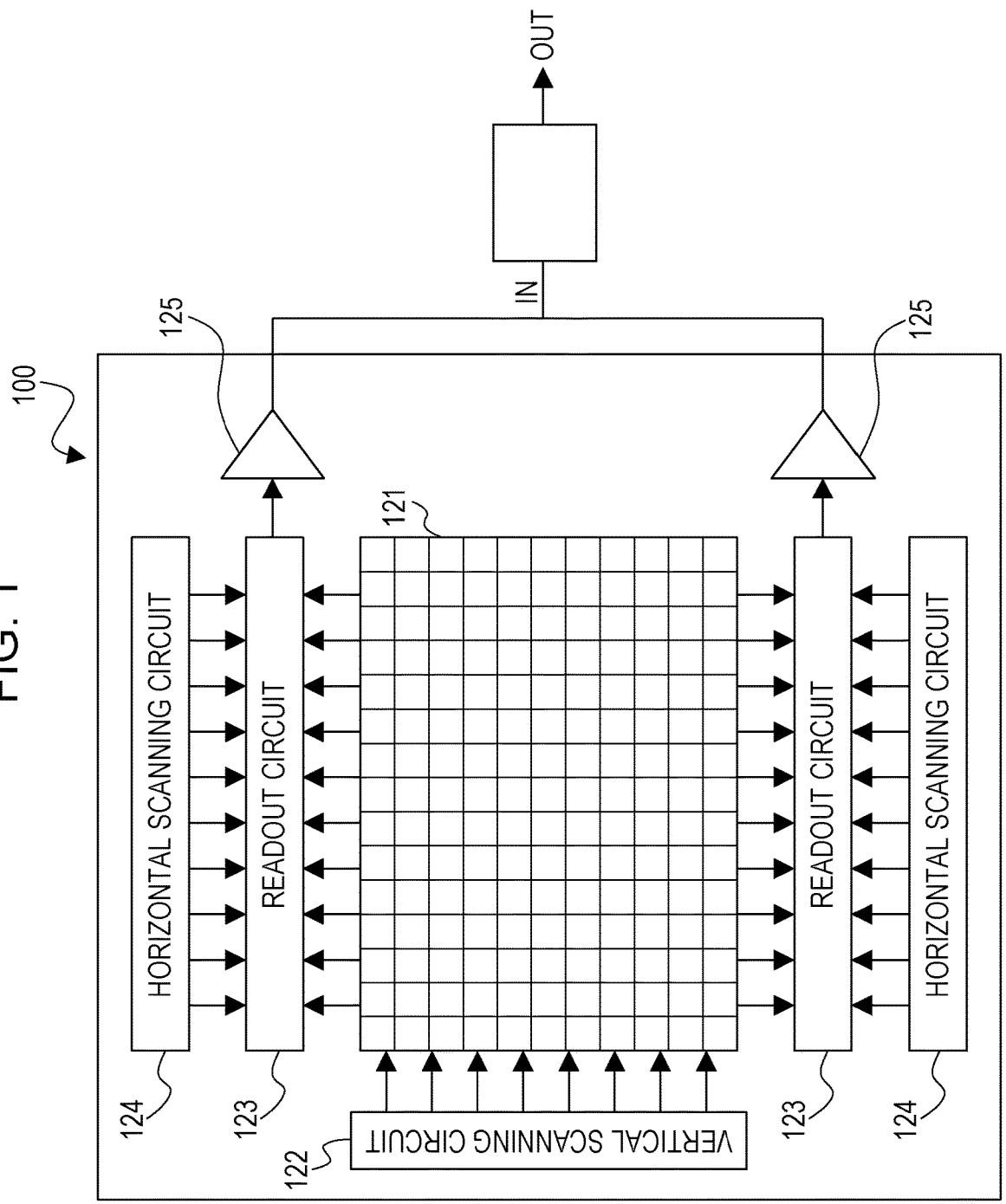
FIG. 1 is an explanatory diagram for describing a first exemplary embodiment according to one or more aspects of the present disclosure.

FIG. 1 is a block diagram of an imaging sensor 100 including focusing pixels and imaging pixels according to one or more aspects of the present disclosure. The imaging sensor 100 is provided with a pixel area 121, a vertical scanning circuit 122, two readout circuits 123, two horizontal scanning circuits 124, and two output amplifiers 125. A region other than the pixel region 121 is a peripheral circuit region. A large number of focusing pixels and imaging pixels are two-dimensionally arranged in the pixel region 121. The readout circuit 123 such as, for example, a column amplifier, a correlated double sampling (CDS) circuit, an adder circuit, or the like is provided in the peripheral circuit region, and amplification, addition, or the like is performed on a signal read out from a pixel in a row selected by the vertical scanning circuit 122 via a vertical signal line. The horizontal scanning circuit 124 generates signals for sequentially reading out signals based on pixel signals from the readout circuit 123. The output amplifier 125 amplifies and outputs a signal in a column selected by the horizontal scanning circuit 124. A configuration in which an electron is used as a signal charge is exemplified, but a hole can also be used as the signal charge.

Pixel Configuration in Each Pixel

Figure 2B:
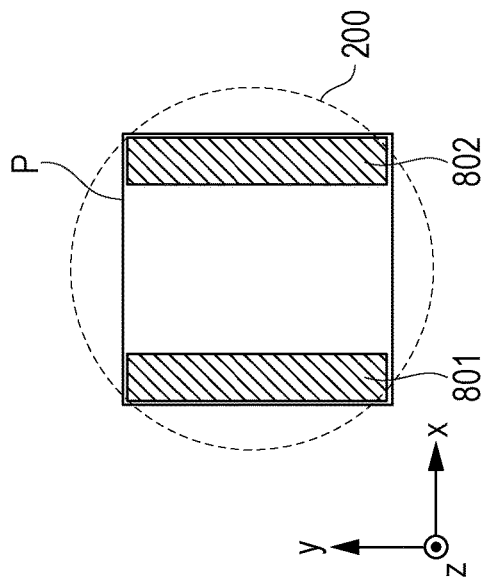
FIGS. 2A to 2D are explanatory diagrams for describing the first exemplary embodiment according to one or more aspects of the present disclosure.
Figure 2D:
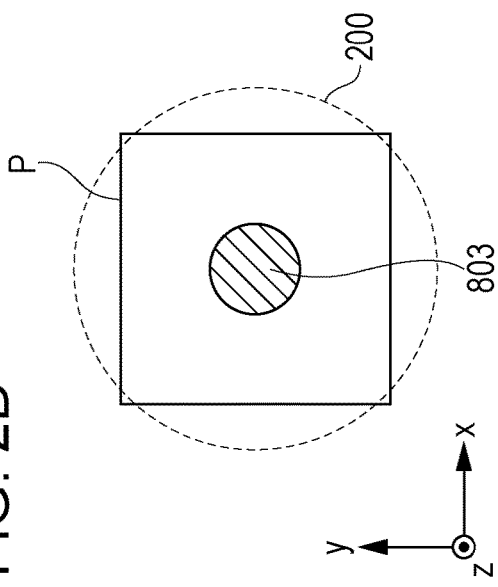
Figure 2A:
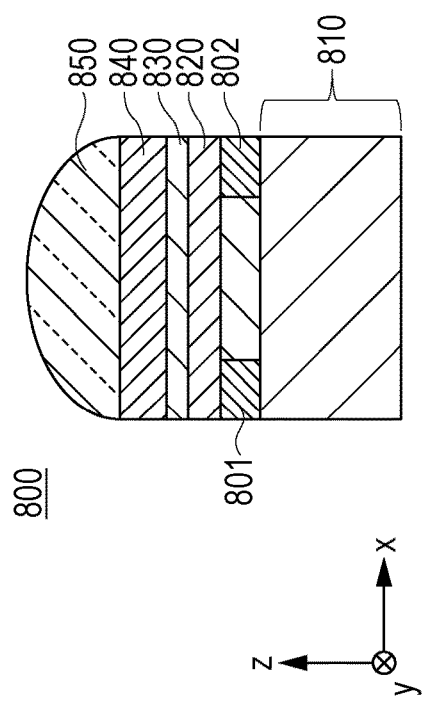

FIG. 2A is the cross sectional view of a focusing pixel 800, and FIG. 2B is the plan view of the focusing pixel 800. Part of components illustrated in the cross sectional view is omitted in the plan view, and the cross sectional view is partly illustrated more abstractly than the plan view. In FIG. 2A, a member 810 schematically illustrates a semiconductor substrate, a wiring layer, a readout circuit, and the like. The electrode 801 (first electrode) and the electrode 802 (second electrode) corresponding to lower electrodes are provided on the member 810. A photoelectric conversion layer 820 and a counter electrode 830 corresponding to an upper electrode are provided on the electrode 801 and the electrode 802. The photoelectric conversion layer 820 is arranged so as to be sandwiched by the electrode 801 (802) and the counter electrode 830. A color filter 840 and a micro lens 850 are provided on the counter electrode 830.

The member 810 includes a wiring layer including a plurality of insulating films and conductive lines. A layer constituting an insulating film is made, for example, of silicon oxide, BPSG, PSG, BSG, silicon nitride, or silicon carbide. In addition, a conductive material such as copper, aluminum, tungsten, tantalum, titanium, or polysilicon is used for the conductive lines.

The electrodes 801 and 802 are thin film electrodes and are formed of a transparent or opaque conductive member such as ITO or aluminum. The electrodes 801 and 802 are configured to separate and collect the charges generated in the respective regions of the photoelectric conversion layer 820.

The photoelectric conversion layer 820 includes an organic compound that generates the charges in accordance with the light amount of incident light. A functional layer such as a charge blocking layer for suppressing injection of the charges from the electrode to the photoelectric conversion layer 820 may also be provided between the photoelectric conversion layer 820 and the electrodes 801 and 802 or between the photoelectric conversion layer 820 and the counter electrode 830.

The counter electrode 830 is an electrode that faces the electrodes 801 and 802 and is provided so as to cover the photoelectric conversion layer 820. The counter electrode 830 is an electrode configured to apply a voltage to the photoelectric conversion layer 820 and generate an electric field in the photoelectric conversion layer 820. Since the counter electrode 830 is provided on an incident surface side of the light with respect to the photoelectric conversion layer 820, the counter electrode 830 is constituted by using a conductive member such as ITO that is transparent with respect to the incident light.

The color filter 840 is a filter through which light of R (red), G (green), and B (blue) or light of C (cyan), M (magenta), and Y (yellow) transmits. The color filter 840 may also be a white filter or IR (infrared) filter through which light having wavelength of RGB or CMY transmits. In particular, in a case where focusing is performed, it is not necessary to distinguish a color, and a sensitivity is improved when the white filter is used for a pixel for the focusing. In a case where a plurality of types of the color filters 840 are used and a step is formed between the color filters, a planarization layer may be provided on the color filters 840.

The micro lens 850 is formed by using a material such as resin. In a case where shapes of the micro lenses appropriate to the focusing and the imaging are different from each other, the shapes of the micro lenses provided to the pixel for the focusing and the pixel for the imaging may be varied from each other. As illustrated in FIG. 2B, in the plan view, the electrode 801 is arranged in one end portion of a pixel P (first pixel), and the electrode 802 is arranged in the other end portion of the pixel P. The electrode 801 and the electrode 802 are arranged so as to face each other in the x direction (first direction), and the x direction corresponds to a phase difference detection direction. Distance measurement is performed on the basis of signals obtained from the electrode 801 and the electrode 802. It should be noted that, for example, a region where one micro lens is provided can also be defined as one pixel.

Figure 2C:
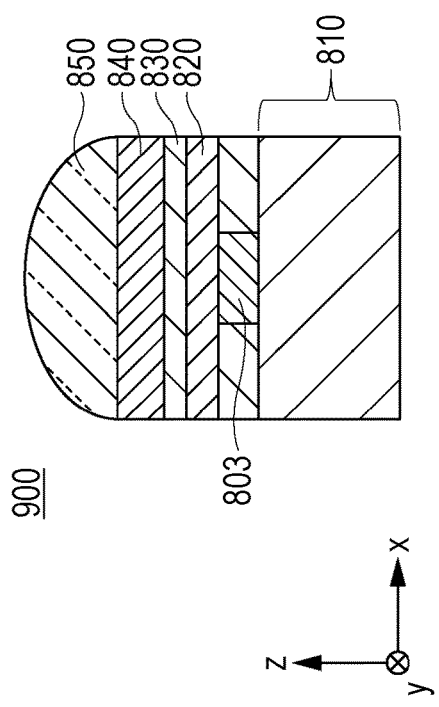

FIG. 2C is the cross sectional view of the imaging element 900, and FIG. 2D is the plan view of the imaging element 900. As illustrated in FIG. 2D, an electrode 803 (third electrode) is provided in a center portion of the pixel P (second pixel). The electrode 803 is also configured to separate and collect the charges generated in the respective regions of the photoelectric conversion layer 820 and is formed of a transparent or opaque conductive member.

When FIG. 2B and FIG. 2D are compared with each other, a length of the electrode 803 in the y direction (second direction) corresponding to the direction orthogonal to the x direction is shorter than a length of the electrode 801 and the electrode 802. For example, the length of the electrode 803 in the y direction is one third or less of the length of the electrode 801 and the electrode 802. In addition, a width of the electrode 803 in the x direction is shorter than a distance between the electrode 801 and the electrode 802. For example, the width of the electrode 803 in the x direction is one third or less of a width of the pixel P, and the distance between the electrode 801 and the electrode 802 is one half or more of the width of the pixel P. Moreover, an area of the electrode 803 is smaller than a sum of an area of the electrode 801 and an area of the electrode 802. With this configuration, the pupil area corresponding to the electrode 803 is limited in the vicinity of the optical axis, and the pupil area can be reduced.

Furthermore, a width of the electrode 801 and the electrode 802 in the x direction is narrower than a width of the electrode 803. That is, the electrode 801 and the electrode 802 have a configuration of being edged up to both ends of the pixel. With this configuration, the distance between the centroids of the pupil areas corresponding to the electrode 801 and the electrode 802 can be widened. For example, the width of the electrode 801 and the electrode 802 in the x direction is one quarter or less of the width of the pixel P.

FIGS. 2B and 2D illustrate an outer edge 200 of the micro lens 850, and a common micro lens is provided to the electrode 801 and the electrode 802. A relationship between the micro lens and the respective electrodes will be described with reference to FIG. 3.

Figure 3:
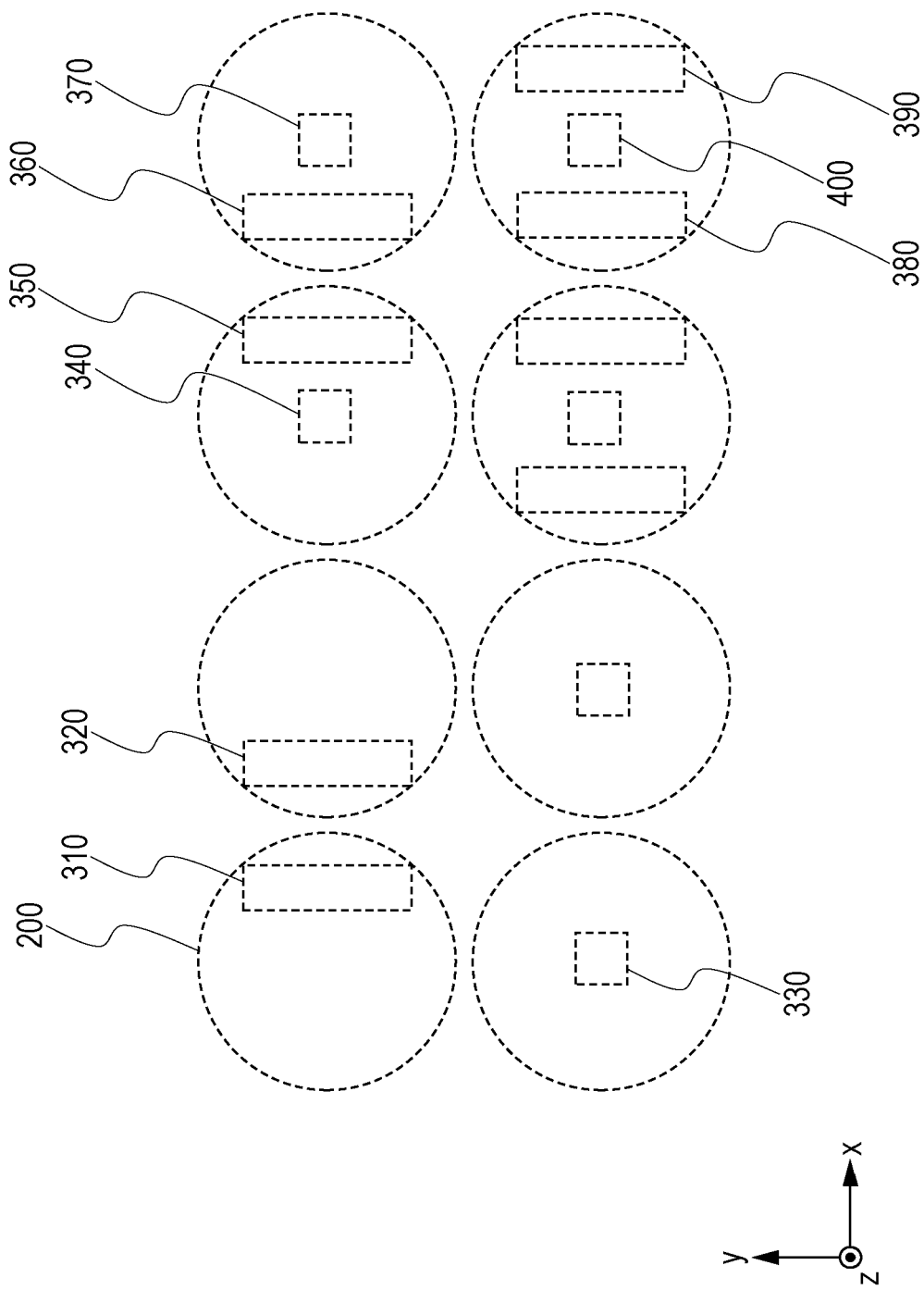
FIG. 3 is an explanatory diagram for describing the first exemplary embodiment according to one or more aspects of the present disclosure.

FIG. 3 schematically illustrates the micro lenses arranged in the pixel region 121. The plurality of micro lenses are one-dimensionally arranged in the x direction (first direction). This structure is referred to as a micro lens group. While the plurality of micro lenses groups are arranged along the y direction (second direction) orthogonal to the first direction, the plurality of micro lenses are two-dimensionally arranged. This structure is referred to as a micro lens array. Each of the plurality of micro lenses has the outer edge 200. In addition, each of the plurality of micro lenses has a center. These micro lenses have a first end portion and a second end portion arranged in the x direction while the center is put in between the first end portion and the second end portion. A plurality of electrodes are arranged so as to be overlapped with one another in the plan view on the plurality of micro lenses. For example, in FIG. 3, an element 320, an element 360, and an element 380 schematically illustrate the first electrode arranged so as to overlap the first end portion of the micro lens. In addition, an element 310, an element 350, and an element 390 schematically illustrate the second electrode arranged so as to overlap the second end portion of the micro lens. Furthermore, an element 330, an element 340, an element 370, and an element 400 schematically illustrate the third electrode arranged so as to overlap the center of the micro lens. In this manner, at least one of the first electrode, the second electrode, and the third electrode is arranged in the respective micro lenses while corresponding to the respective positions of the micro lenses.

According to the configuration described above, it is possible to provide the imaging sensor in which both the high focusing accuracy and the deep depth of field can be achieved.

Modified Example of the First Exemplary Embodiment

Figure 4A:
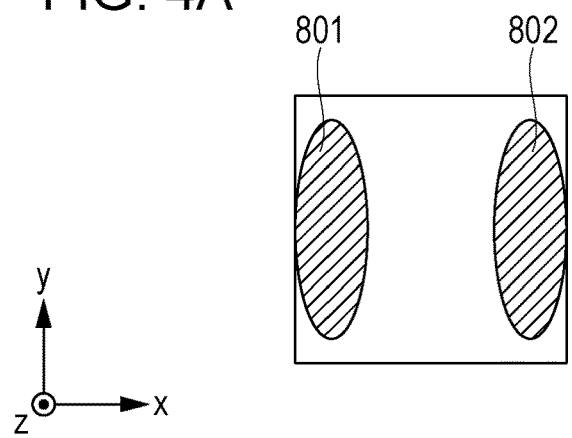
FIGS. 4A to 4C are explanatory diagrams for describing the first exemplary embodiment according to one or more aspects of the present disclosure.
Figure 4B:
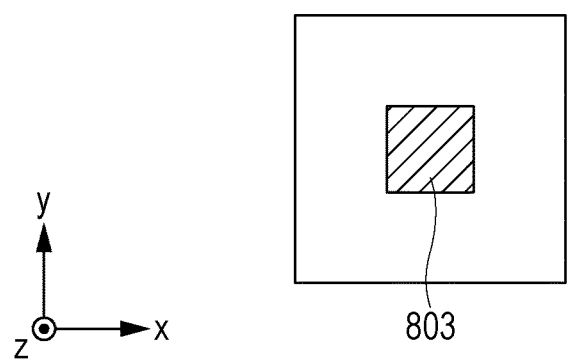
Figure 4C:
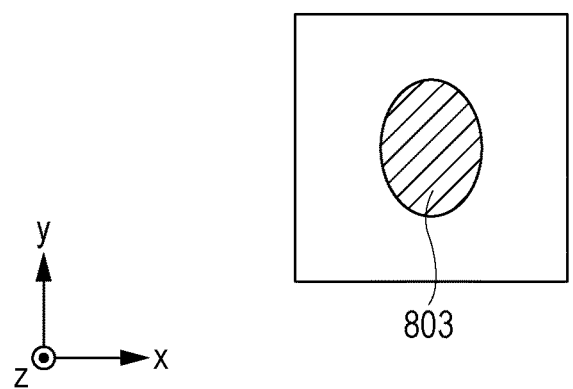

FIGS. 4A to 4C illustrate a modified example of the present exemplary embodiment. FIG. 4A is a plan view of the focusing pixel 800. As illustrated in FIG. 4A, shapes of the electrodes 801 and 802 of the focusing pixel 800 do not necessarily need to be rectangular and may also be elliptical. FIGS. 4B and 4C are plan views of the imaging pixel 900. As illustrated in FIGS. 4B and 4C, a shape of the electrode 803 of the imaging pixel 900 may be rectangular or elliptical. Furthermore, the electrode 803 may have a shape of a polygon such as a pentagon or an octagon.

Second Exemplary Embodiment

Figure 5:
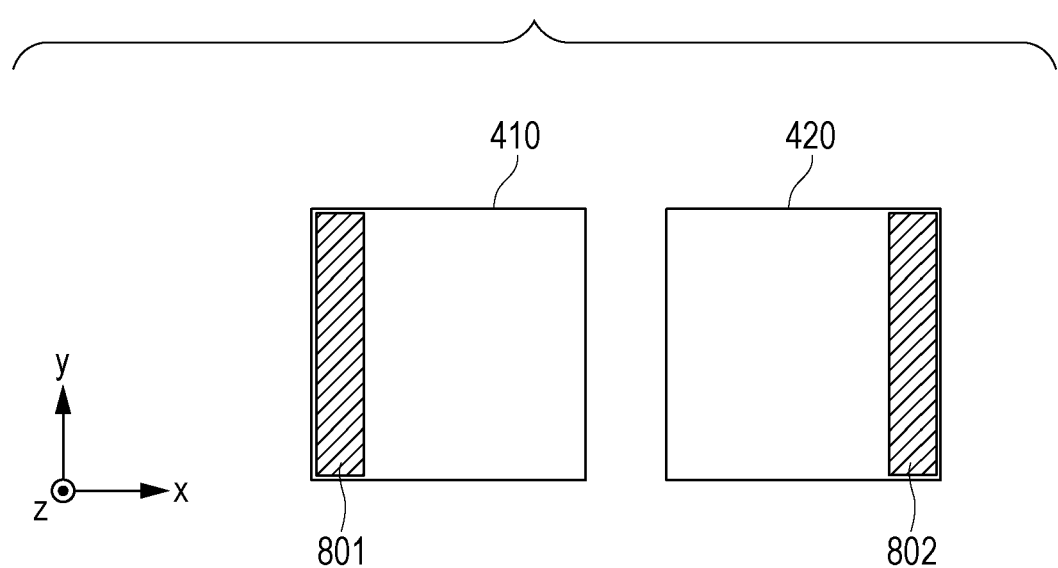
FIG. 5 is an explanatory diagram for describing a second exemplary embodiment according to one or more aspects of the present disclosure.

FIG. 5 illustrates configuration examples of a first pixel 410 and a second pixel 420 corresponding to the focusing pixel. A first micro lens (not illustrated) is provided to the first pixel 410, and a second micro lens (not illustrated) is provided to the second pixel 420. According to the first exemplary embodiment, one focusing pixel includes the two electrodes, but as illustrated in FIG. 5, a configuration may also be adopted in which the first pixel 410 and the second pixel 420 include one pixel each.

Third Exemplary Embodiment

Figure 6A:
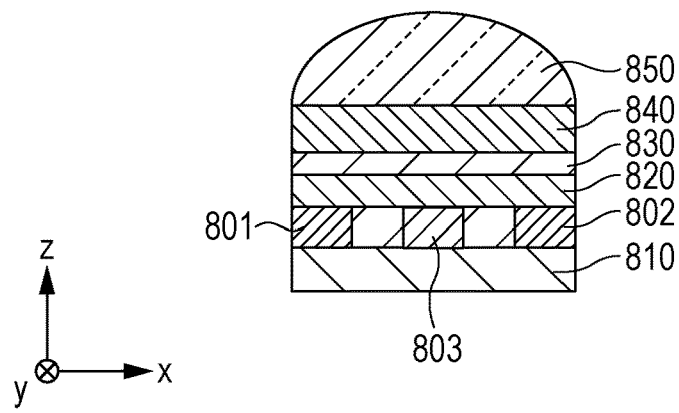
FIGS. 6A to 6C are explanatory diagrams for describing a third exemplary embodiment according to one or more aspects of the present disclosure.
Figure 6B:
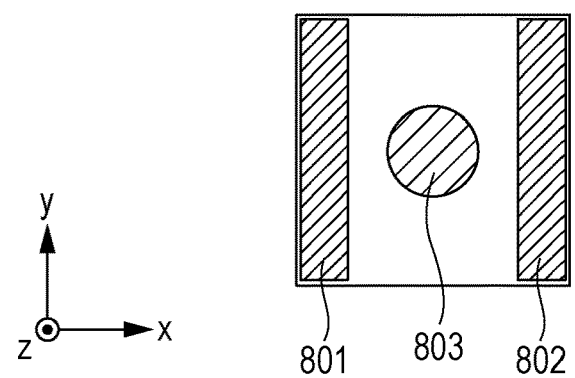

FIGS. 6A and 6B are a cross sectional view and a plan view illustrating a mode in which all the focusing electrodes 801 and 802 and the imaging electrode 803 are arranged in the pixel P. According to the first and second exemplary embodiments, the focusing pixel and the imaging pixel are different pixels, and the electrode is not arranged in the center portion of the focusing pixel. However, as in the present exemplary embodiment, the configuration for the focusing and the configuration for the imaging can also be provided in one pixel. In addition, in a case where both the configurations are provided in the one pixel, as illustrated in FIG. 6C, the focusing electrodes 801 and 802 may have a shape curved in a circular arc so as to follow the shape of the imaging electrode 803.

Figure 6C:
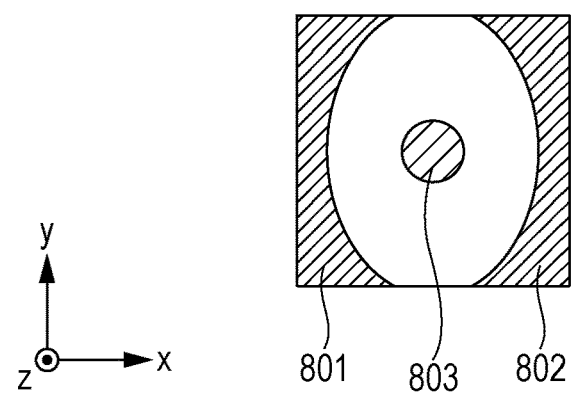
Figure 7A:
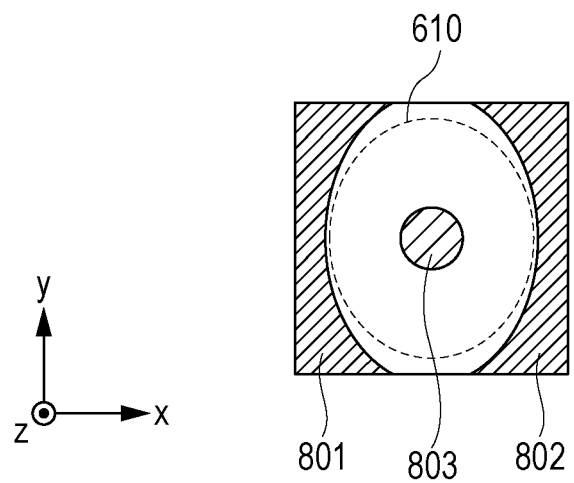
FIGS. 7A and 7B are explanatory diagrams for describing another exemplary embodiment according to one or more aspects of the present disclosure.
Figure 7B:
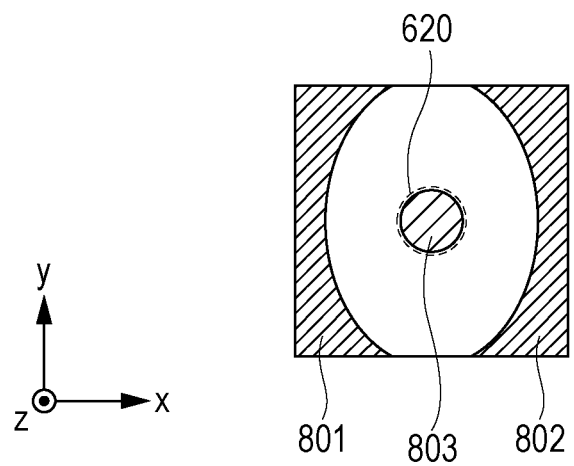

FIGS. 7A and 7B are explanatory diagrams for describing an example in which a function of HDR is realized by using the configuration example illustrated in FIG. 6C. In FIGS. 7A and 7B, the electrode 803 is connected to the pixel circuit, and the electrodes 801 and 802 are connected to a power supply where a voltage is variable. While the voltage of this power supply is controlled, it is possible to control the region where the charges in the photoelectric conversion layer 820 can be collected. That is, in a case where the hole is used as the signal charge, when the voltage of the power supply is increased, a size of a charge collection region 610 is expanded as illustrated in FIG. 7A. On the other hand, when the voltage of the power supply is decreased, as illustrated in FIG. 7B, a size of a charge collection region 620 is reduced. When this configuration is used, the signal charges can be obtained from the expanded charge collection region 610 in the first pixel, and the signal charges can be obtained from the reduced charge collection region 620 in the second pixel. When images generated from the signal charges obtained in the first pixel and the second pixel are combined with each other, it is also possible to obtain an image in which a dynamic range is expanded.

Other Exemplary Embodiment

Exemplary Embodiment of an Imaging System

The present exemplary embodiment relates to an imaging system using the imaging sensor including the focusing pixel and the imaging pixel described according to the above-described exemplary embodiments. For example, an in-vehicle camera is used as the imaging system.

Figure 11:
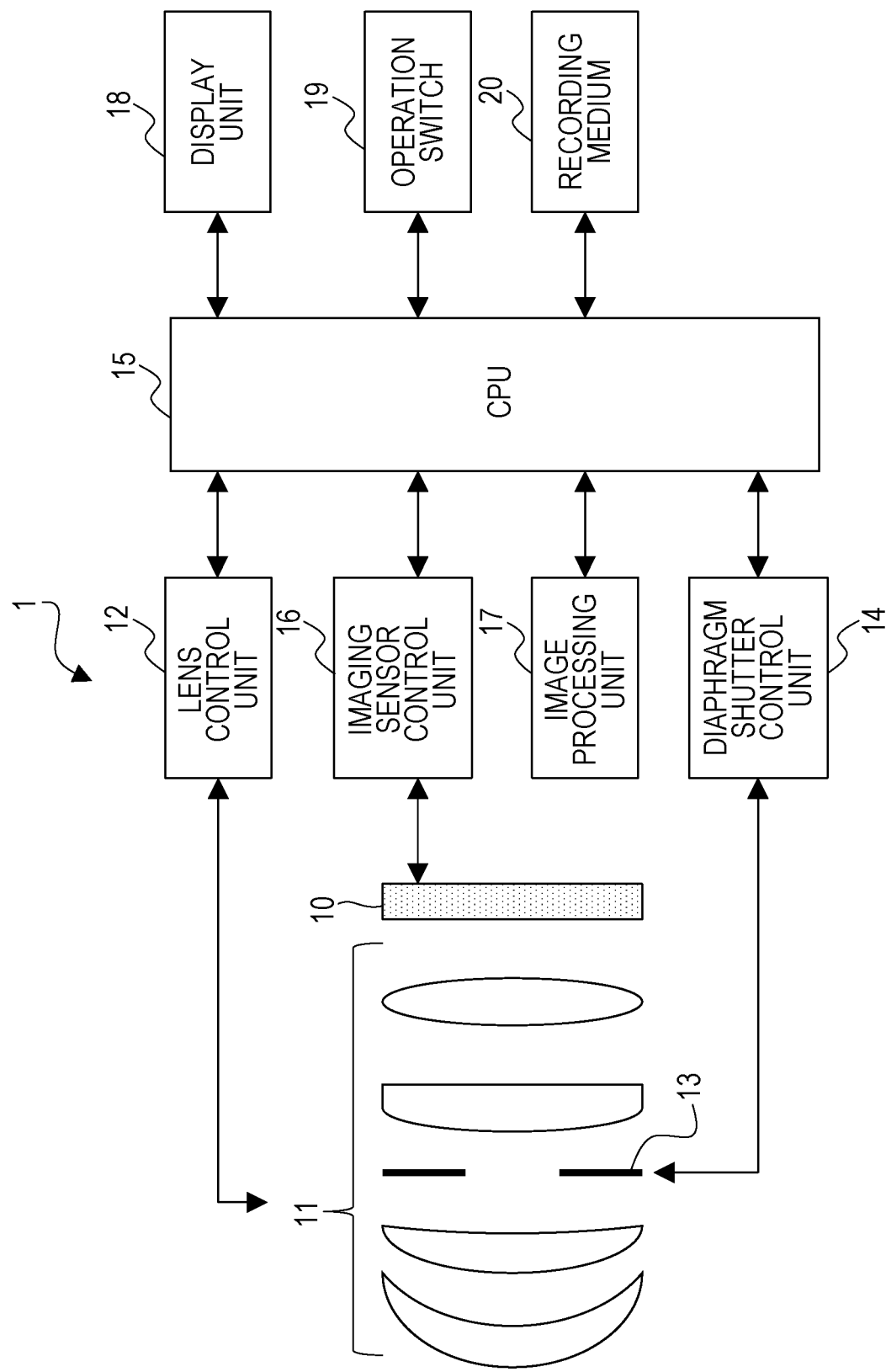
FIG. 11 is an explanatory diagram for describing another exemplary embodiment according to one or more aspects of the present disclosure.

FIG. 11 illustrates a configuration of an imaging system 1. An imaging lens corresponding to an imaging optical system 11 is mounted to the imaging system 1. The imaging optical system 11 controls a focus position by a lens control unit 12. A diaphragm 13 is connected to a diaphragm shutter control unit 14 and performs light amount adjustment by changing an opening diameter of the diaphragm. An imaging plane of an imaging sensor 10 is arranged in an image space of the imaging optical system 11 to obtain an object image formed by the imaging optical system 11. A CPU 15, which may include one or more processors and one or more memories, is a controller and governs control of various operations of the camera. The CPU 15 includes a calculation unit, a read only memory (ROM), a random access memory (RAM), an analog-to-digital (A/D) converter, a digital-to-analog (D/A) converter, a communication interface circuit, and the like. The CPU 15 controls operations of the respective units in the camera in accordance with a computer program stored in the ROM and executes a series of imaging operations such as measurement of a distance to the object, autofocus (AF) including detection of a focus state of an imaging optical system (focus detection), imaging, image processing, and recording. The CPU 15 is equivalent to a signal processing unit. An imaging sensor control unit 16 controls the operation of the imaging sensor 10 and also transmits pixel signals (imaging signals) output from the imaging sensor 10 to the CPU 15. An image processing unit 17 generates image signals by performing image processing such as γ conversion or color interpolation on the imaging signals. The image signals are output to a display unit 18 such as a liquid crystal display (LCD). The CPU 15 is operated by an operation switch 19, and a picked-up image is recorded in a detachable recording medium 20.

Exemplary Embodiment of an In-Vehicle Imaging System

Figure 12A:
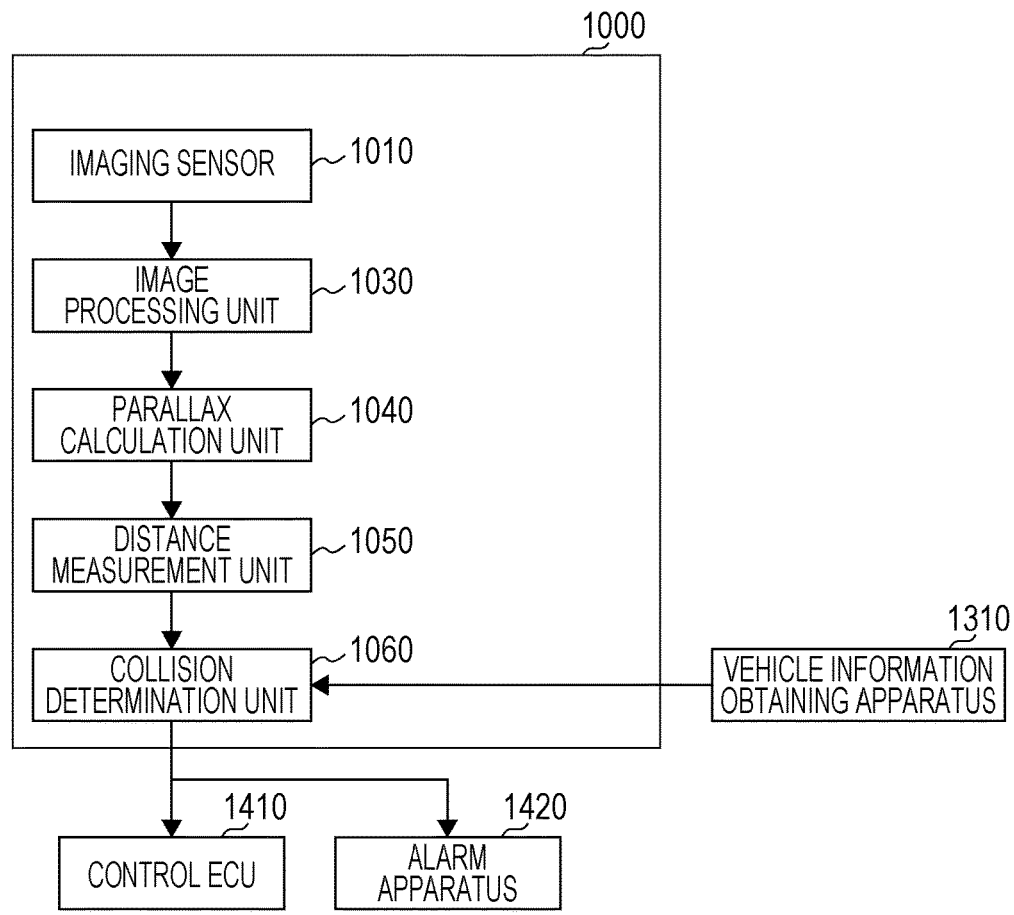
FIGS. 12A and 12B are explanatory diagrams for describing another exemplary embodiment according to one or more aspects of the present disclosure.
Figure 12B:
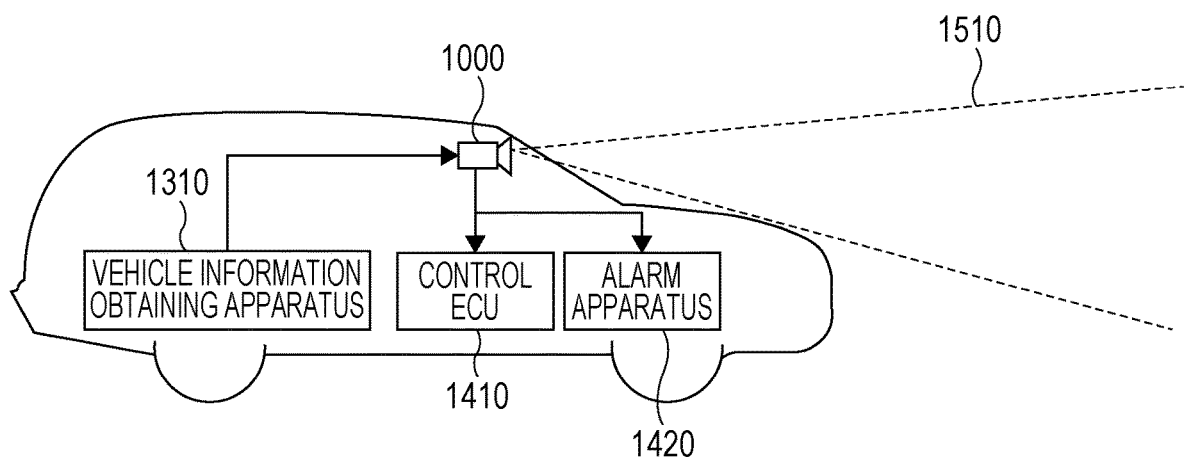

FIGS. 12A and 12B illustrate an example of an imaging system related to an in-vehicle camera. An imaging system 1000 includes focusing pixels and imaging pixels according to one or more aspects of the present disclosure. The imaging system 1000 includes an image processing unit 1030 configured to perform image processing on plural pieces of image data obtained by an imaging sensor 1010 and a parallax calculation unit 1040 configured to calculate a parallax (phase difference of the parallax images) on the basis of the plural pieces of image data obtained by the imaging system 1000. In addition, the imaging system 1000 includes a distance measurement unit 1050 configured to calculate a distance to a target object on the basis of the calculated parallax and a collision determination unit 1060 configured to determine whether or not a collision probability exists on the basis of the calculated distance.

Herein, the parallax calculation unit 1040 and the distance measurement unit 1050 are examples of a distance information obtaining unit configured to obtain distance information to the target object. That is, the distance information refers to information on the parallax, the de-focusing amount, the distance to the target object, or the like. The collision determination unit 1060 may determine the collision probability by using any of these pieces of distance information. The distance information obtaining unit may be realized by dedicatedly designed hardware or may also be realized by software module. In addition, the distance information obtaining unit may be realized by a field programmable gate array (FPGA), an application specific integrated circuit (ASIC), or the like or may also be realized by any combination of these elements.

The imaging system 1000 is connected to a vehicle information obtaining apparatus 1310 and can obtain vehicle information such as a vehicle speed, a yaw rate, or a rudder angle. A control electrical control unit (ECU) 1410 corresponding to a control apparatus configured to output a control signal for generating braking force to the vehicle on the basis of the determination result in the collision determination unit 1060 is also connected to the imaging system 1000. An alarm apparatus 1420 configured to issue a warning to a driver on the basis of the determination result in the collision determination unit 1060 is also connected to the imaging system 1000. For example, in a case where the collision probability is high as the determination result in the collision determination unit 1060, the control ECU 1410 performs vehicle control to avoid a collision or alleviate a damage by applying a brake, releasing an accelerator, suppressing an engine output, or the like. The alarm apparatus 1420 issues a warning to a user by sounding an alarm such as sound, displaying warning information on a screen such as a car navigation system, vibrating a seat belt or steering, or the like.

According to the present exemplary embodiment, a surrounding of the vehicle such as, for example, a forward area or a backward area is imaged by the imaging system 1000. FIG. 12B illustrates the imaging system in a case where the forward area of the vehicle is imaged. In addition, the example of the control for avoiding the collision with the other vehicle has been described above, but the present exemplary embodiment can also be applied to control for following the other vehicle to perform automated driving, control for the automated driving without drifting from a lane, or the like. Furthermore, the imaging system can be applied to not only the vehicle such as an automobile but also a moving body (moving apparatus) such as, for example, a vessel, aircraft, or industrial robot. In addition, the imaging system can be widely applied to not only the moving body but also a device using object recognition such as an intelligent transport system (ITS).

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2016-042681 filed Mar. 4, 2016, which is hereby incorporated by reference herein in its entirety.

What is claimed is:

1. A photoelectric conversion device comprising:
a plurality of electrodes including a first electrode, a second electrode, and a third electrode arranged between the first electrode and the second electrode;
a photoelectric conversion layer provided over the first electrode, the second electrode, and the third electrode;
a counter electrode provided over the photoelectric conversion layer; and
one micro lens provided so as to correspond to the first electrode, the second electrode, and the third electrode,
wherein the first electrode, the second electrode, and the third electrode are arranged in a first direction,
wherein a length of the third electrode in a second direction corresponding to a direction orthogonal to the first direction is shorter than a length of the first electrode and a length of the second electrode in the second direction,
wherein a width of the third electrode in the first direction is shorter than the length of the first electrode and the length of the second electrode in the second direction,
wherein a first signal that is read out from the first electrode and a second signal that is read out from the second electrode are used for phase difference detection, and
wherein a third signal that is read out from the third electrode is used for imaging and is not used for phase difference detection.

2. The photoelectric conversion device according to claim 1, wherein a width of the first electrode and the second electrode in the first direction is narrower than a width of the third electrode.

3. The photoelectric conversion device according to claim 1, further comprising a common micro lens corresponding to the first electrode and the second electrode.

4. The photoelectric conversion device according to claim 1, wherein a micro lens provided so as to correspond to the first electrode and a micro lens provided so as to correspond to the second electrode are different micro lenses.

5. The photoelectric conversion device according to claim 3, further comprising a common micro lens corresponding to the first electrode, the second electrode, and the third electrode.

6. The photoelectric conversion device according to claim 1, wherein the first electrode and the second electrode are rectangular, and the third electrode is circular.

7. The photoelectric conversion device according to claim 1, wherein the first electrode and the second electrode have a shape curved in a circular arc, and the third electrode is circular.

8. The photoelectric conversion device according to claim 1, wherein an area of the third electrode is smaller than a sum of an area of the first electrode and an area of the second electrode.

9. A moving body comprising:
the photoelectric conversion device according to claim 1; and
at least one processor configured to function as:
a distance information obtaining unit configured to obtain distance information to a target object on a basis of parallax information based on a signal from the photoelectric conversion device; and
a control unit configured to control the moving body on a basis of the distance information.

10. A photoelectric conversion device comprising:
a plurality of pixels arranged, wherein at least one of pixels includes
a plurality of electrodes including a first electrode, a second electrode, and a third electrode arranged between the first electrode and the second electrode;
a photoelectric conversion layer provided over the first electrode, the second electrode, and the third electrode;
a counter electrode provided over the photoelectric conversion layer; and
one micro lens provided so as to correspond to the first electrode, the second electrode, and the third electrode;
wherein the first electrode, the second electrode, and the third electrode are arranged in a first direction,
wherein a first signal that is read out from the first electrode and a second signal that is read out from the second electrode are used for phase difference detection, and
wherein a third signal that is read out from the third electrode is used for imaging and is not used for phase difference detection.

11. The photoelectric conversion device according to claim 10, wherein, in the first direction, each of a width of the first electrode and a width of the second electrode is less than a width of the third electrode.

12. The photoelectric conversion device according to claim 10, wherein the first electrode and the second electrode are rectangular, and the third electrode is circular.

13. The photoelectric conversion device according to claim 10, wherein each of the first electrode and the second electrode has a portion curved in a circular arc, and the third electrode is circular.

14. The photoelectric conversion device according to claim 10, wherein an area of the third electrode is smaller than a sum of an area of the first electrode and an area of the second electrode.

15. The photoelectric conversion device according to claim 10, wherein the third signal is not used for phase difference detection.

16. A moving body comprising:
the photoelectric conversion device according to claim 10; and
at least one processor configured to function as:
a distance information obtaining unit configured to obtain information about a distance to a target object from parallax information based on a signal from the photoelectric conversion device; and
a control unit configured to control the moving body based on the information about the distance.

* * * * *